United States Patent [19]

Berg

[11] Patent Number: 5,281,325
[45] Date of Patent: Jan. 25, 1994

[54] UNIFORM ELECTROPLATING OF PRINTED CIRCUIT BOARDS

[76] Inventor: N. Edward Berg, 43 Smith Rd., Bedford, N.H. 03110

[21] Appl. No.: 907,830

[22] Filed: Jul. 2, 1992

[51] Int. Cl.$^5$ .................... C25D 5/02; C25D 17/00
[52] U.S. Cl. .............................. 205/125; 204/194
[58] Field of Search ....................... 205/125; 204/194

[56] References Cited

U.S. PATENT DOCUMENTS 3,809,642  5/1974  Bond ..................................... 205/78

FOREIGN PATENT DOCUMENTS 2-25694  9/1990  Japan .

Primary Examiner—T. M. Tufariello
Attorney, Agent, or Firm—Hayes, Soloway, Hennessey & Hage

[57] ABSTRACT

A method and apparatus for the uniform electroplating of printed circuit boards is described. At least one non conductive apertured mask covers selected areas of the electroactive surface of the anode or cathode electrode, whereby to establish substantially uniform electroplating ion transfer over the target areas of the target cathode.

8 Claims, 1 Drawing Sheet

UNIFORM ELECTROPLATING OF PRINTED CIRCUIT BOARDS

TECHNICAL FIELD OF THE INVENTION

This invention relates to electroplating or electro-deposition of metal on a target. The invention has particular utility in connection with electro-deposition of metal onto printed circuit boards or panels and will be described in connection with such utility, although other utilities are contemplated.

BACKGROUND OF THE INVENTION

Electroplating is an established process of producing a metallic coating on a surface. Such coatings may perform a protective function to prevent corrosion of the metal on which they are deposited, e.g., plating with zinc or tin (electro-galvanizing); or a decorative function, e.g., gold or silver plating; or both functions, e.g., chromium plating.

The principal of electroplating is that the coating metal is deposited from an electrolyte, typically an aqueous acid or alkaline solution, onto a target substrate or panel. The latter forms the cathode (negative electrode) while a plate of the metal to be deposited serves as the anode (positive electrode).

During a standard electroplating process, the periphery of the printed circuit board, i.e., the portions of the printed circuit board adjacent its outer edges, tends to be at a higher current density than the center of the printed circuit board. Hence, metal deposits more rapidly adjacent the periphery of the printed circuit board than at the center. The result of this is that by the time the metal has deposited at the center of the circuit board to form a desired thickness, the metal deposited adjacent the periphery is at a thickness much greater than the thickness at the center. As a result, the width of depositing metal lines may grow laterally, and the resulting plated lines near the periphery may develop a cross sectional configuration resembling a mushroom.

In U.S. Pat. No. 4,828,654, it is reported that by spacing the cathode a relatively large distance from the anode, and by making the effective size of the panel to be plated, i.e. the cathode, larger in size than the anode, there is more uniform distribution of the electroplating field. The more uniformly distributed field causes the metallic ions to be electrolytically deposited at a more uniform rate over the articles in the panel. This prior art arrangement reportedly avoids undesirable uneven plating build-up on the articles at those areas where there is a concentration of the electroplating field. It is also reported that field concentrations occur when the size of the article is smaller than the size of the anode, and results in the edges of the article experiencing a substantial greater build up of metallic ions than the center area of the article. Making the effective size of the cathode (the article to be plated) greater than the size of the anode and spacing the anode a relatively large distance from the cathode, operates to discourage the formation of areas of concentration in the electroplating field and encourages the ion transfer to become more uniform over the entire area of the cathode.

U.S. Pat. No. 4,828,654 teaches an anode used in electroplating formed by a plurality of individual anode segments which can be selectively energized to establish an effective anode size that relates to the size of the article to be electroplated, thereby establishing an electrical field of more uniform characteristics to transfer ions from the anode to the articles at a more uniform deposition rate over the whole surface of the article. By adjusting the effective size of the anode to correspond and relate to the size of the article, the non-uniform deposition rates associated with concentrated localized field reportedly are avoided, and the physical size of the electroplating apparatus can be reduced.

U.S. Pat. No. 4,933,061 teaches an electroplating apparatus for electroplating a plurality of items. The patented apparatus includes a tank having a bottom wall and side walls, adapted to hold a predetermined quantity of electrolytic plating solution. A sparger system at the bottom of the tank directs the electrolytic plating solution in an upward direction. A cathode rack supports the items to be electroplated and extends intermediate to the anode plates and upwardly from the sparger system. Strategically placed openings in the anodes and an anode screen in conjunction with the sparger system reportedly act to reduce the plating thickness variance over the rack.

In U.S. Pat. No. 5,017,275, there is disclosed an anode structure comprising a resilient anode sheet having an active anode surface, and a support sub-structure for the anode sheet. The anode sub-structure has a pre determined configuration. By flexing the anode sheet onto the anode sub-structure, so that the anode sheet conforms to the configuration of the anode sub-structure, there reportedly is provided an adequate electrical junction for substantially uniform current distribution.

A collection of the known variables which affect the electroplating process have been set out in detail in the *HANDBOOK OF PRINTED CIRCUIT MANUFACTURING* by Raymond H. Clark (1985). Therein it is reported that the factors which effect the electroplating process include: 1. plating pattern geography; 2. panel thickness and size of plated through holes; 3. panel boarders; 4. plating rack; 5. bath chemistry, e.g., concentration of metals and acids, concentration of organic leveling and brightening agents, concentration of contaminants; 6. bath temperature; 7. anode-cathode spacing; 8. anode current density; 9. anode depletion; 10. plating bath agitation; 11. cathode agitation; 12. rectifier consideration; and 13. the skill and experience of the plater.

The present invention provides an improved electroplating system which overcomes the aforesaid and other problems of the prior art which have resulted in less than uniform electroplating and metallic deposition, and in so doing provides substantially uniform distribution of the deposited metal, from item to item in an electroplating process.

SUMMARY OF THE INVENTION

In accordance with the present invention, a system for electroplating comprises a receptacle for holding a bath of electroplating solution. An electrically conducting anode electrode is positioned within the receptacle in contact with the bath. The anode is covered at least in part with one or more electrically non-conductive masks which operate to direct the electric current as it travels through the electroplating solution to distribute over the cross-sectional surface area of a conductive substrate immersed in the electroplating receptacle at a location spaced apart from the anode to establish substantially uniform electroplating ion transfer over the surface of the substrate. The mask or masks may be in direct contact with the anode, or in close proximity thereto. Completing the system are means for electrically energizing the anode and completing the circuit to the target/cathode.

The overall size of the anode, and the size and shape of the mask or masks, mask openings, number of openings, and location of openings in the non-conductive mask are all selected with reference to the size, target configuration and aspect ratio (anode-to-target) of the article to be electroplated. The distance separating the masked anode from the target panel substrate also is adjusted to promote uniform targeting of the electroplating current.

The present invention also provides a method of electroplating an article with a generally uniform thickness coating by covering the anode electrode at least in part with one or more electrically non-conductive masks having a pattern of openings of predetermined configuration relative to the target cathode whereby to result in substantially uniform deposition over the target during electroplating.

BRIEF DESCRIPTION OF THE DRAWINGS

Further features and advantages of the present invention will be apparent from the following detailed description of the invention taken in conjunction with the drawings, wherein like numerals depict like parts, and wherein.

DETAILED DESCRIPTION OF PREFERRED EMBODIMENTS

Figure 1:
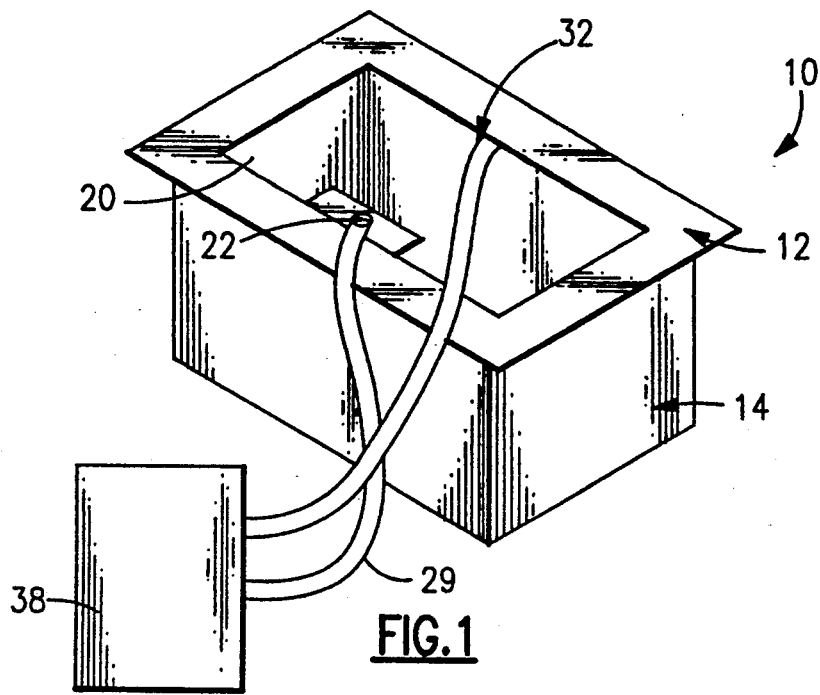
FIG. 1 is a perspective view of an electroplating apparatus embodying the present invention.
Figure 2:
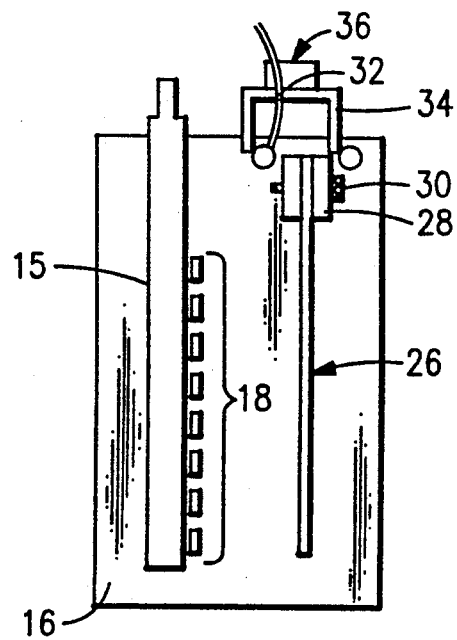
FIG. 2 is a side view of portions of the electroplating system of FIG. 1.

Referring to FIGS. 1 and 2, the electroplating system 10 includes an outer housing 12 which is preferably formed of an electrically insulating and corrosion-resistant material such as plastic. The housing 12 includes means in the form of a downward extending receptacle 14 for holding a bath of an electroplating solution 16. By way of example, for electroplating copper, bath 16 may comprise a copper sulfate solution commonly referred to as "acid copper". The plastic material of the housing 12 and receptacle 14 resists the toxic and corrosive effects of the bath 16.

The electroplating system 10 includes an anode electrode 15 which is covered at least in part with a non-conductive mask 18 (FIG. 2), which will be described in detail below. Mask 18 may be coated directly on the electro-active surface of anode electrode 15 or may comprise a separate element which may be fixed to or suspended in close proximity to the electro-active surface of electrode 15. The anode electrode 15 and mask 18 are suspended from an upper support member 20 which is preferably formed of plastic to resist the corrosive effects of the bath 16 and to provide electrical insulation. The anode electrode 15 and mask 18 are held suspended from the support member 20 by fasteners such as non-corrosive titanium machine screw 22.

The article to be plated typically comprises a printed circuit board 26 which becomes the electrical cathode of the electroplating system during electroplating. The printed circuit board 26 is suspended in the bath by a clamp 28 which includes a thumbscrew 30 or other similar fastening device for attaching and suspending or supporting the article to be electroplated in the bath. Clamp 28 in turn is mechanically connected to an electrically insulating support member 34. A handle 36 extends above the support member to allow the printed circuit board to be inserted into and removed from the bath 16 at the start and end of the electroplating process.

Completing the system are electrical conductors 24 and 32 for electrically connecting the anode electrode 25 and cathode target 26 to a direct current or quasi direct current electrical energy source 38.

A feature and advantage of the present invention is the ability to substantially and uniformly electroplate the conductor paths, lands and holes of a target printed circuit board. This is accomplished by covering selected areas of the electro-active surface of the anode 15 with a non-conductive mask 18 which directs the electric current through the electroplating solution so that the metal will be deposited onto the target cathode in a controlled manner. The overall size of the anode, and the size and shape of the openings, number of openings, and location of the openings in the non-conductive mask are selected with reference to the size and geometry of the target article to be electroplated, with the result that field concentrations at any location on the target article are avoided, thereby achieving a relatively uniform layer of electroplated material.

Typically, the anode mask will have openings which are substantially the negative of the target article; however, in order to compensate for uneven plating buildup on the target panel periphery, the mask openings corresponding to peripheral areas of the target board preferably should be made relatively smaller than corresponding deposition areas on edges of the target board, while the mask openings corresponding to center areas of the target board preferably should be made relatively larger than the corresponding deposition areas on center areas of the target board. Mask size and shape also may be empirically determined using the above criteria. The mask may be applied directly to the anode electroactive surface, for example, by coating, or the mask may comprise a separate element which may be fixed directly to or held in close proximity to the anode electroactive surface, thereby allowing various selected exposed portions of the anode to serve as a source of field concentration for the electroplating process.

The distance between the masked anode and the target printed circuit board should be limited to a relatively short distance, typically 2 to 3.5 inches at normal plating potentials, so that bulk transfer through the electroplating bath does not defeat the masking effect.

Figure 3:
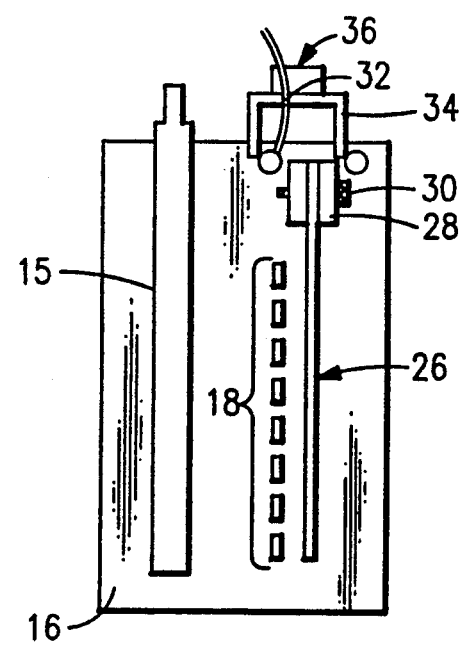
FIG. 3 is a view similar to 2, and illustrating an alternative form of electroplating system made in accordance with the subject invention.

Certain changes may be made in the above constructions without departing from the spirit and scope of the invention. For example, as shown in FIG. 3, it also is possible to achieve uniform deposition by covering the cathode with one or more non-conductive apertured masks. In such case, the mask or masks should be spaced a short distance, e.g. 1.75 to 3 inches from the cathode. Locating the mask less than 1.75 inches or more than 3 inches from the cathode is not advised and does not achieve uniform deposition. It is accordingly intended that all matter contained in the above description or shown in the accompanying drawings shall be interpreted as illustrative and not in a limiting sense.

I claim:

1. In an apparatus for electroplating a target cathode, said apparatus including an anode electrode having an electroactive surface in contact with an electroplating bath, the improvement which comprises at least one electrically non-conductive apertured mask closely spaced from and covering the cathode at least in part whereby to direct electric current through the electroplating solution in a controlled manner onto the target cathode, said at least one mask being spaced from the electroactive surface of the cathode, and at least one additional electrically non-conductive apertured mask covering the anode at least in part.

2. In an apparatus as defined in claim 1, the improvement wherein at least one mask is in direct contact with the anode.

3. In an apparatus as defined in claim 1, the improvement wherein at least one mask is spaced from the electroactive surface of the anode.

4. In an apparatus as defined in claim 1, the improvement wherein at least one mask is spaced 2 to 3.5 inches from the electroactive surface of the anode.

5. In an apparatus as defined in claim 1, the improvement wherein at least one mask comprises a plurality of openings which are adjusted to establish substantially uniform electroplate ion transfer onto the target cathode.

6. In an apparatus for electroplating a target cathode, said apparatus including an anode electrode having an electroactive surface in contact with an electroplating bath, the improvement which comprises at least one electrically non-conductive apertured mask closely spaced from and covering the cathode at least in part whereby to direct electric current through the electroplating solution in a controlled manner onto the target cathode, said at least one mask being spaced 1.75 to 3 inches from the electroactive surface of the cathode, said mask comprising a plurality of openings which are adjusted to establish substantially uniform electroplate ion transfer onto the target cathode.

7. In a method of electroplating selected areas of a target cathode immersed in an electroplating bath having an anode disposed therein, the improvement which comprises covering selected areas of the cathode electroactive surface with at least one non-conductive apertured mask spaced form 1.75 to 3 inches from the electroactive surface of the cathode, and conducting anodic current from the anode to electroplate the masked target cathode, sai at least one mask comprising a plurality of openings which are adjusted to establish substantially uniform electroplate ion transfer onto the target cathode.

8. In a method of electroplating selected areas of a target cathode immersed in an electroplating bath having an anode disposed therein, the improvement which comprises interspacing at least one non-conductive apertured mask between the anode and the cathode whereby to conduct electric current through the electroplating bath in a controlled manner onto the target cathode, wherein said at least one mask is spaced 1.75 to 3 inches from the electroactive surface of the cathode.

* * * * *

UNITED STATES PATENT AND TRADEMARK OFFICE
CERTIFICATE OF CORRECTION

PATENT NO.  : 5,281,325
DATED       : January 25, 1994
INVENTOR(S) : N. Edward Berg It is certified that error appears in the above-indentified patent and that said Letters Patent is hereby corrected as shown below:

Col. 6, line 13, "form" should read --from--.

Col. 6, line 16, "sai" should read --said--.

Signed and Sealed this

Twenty-fourth Day of May, 1994

Attest:

BRUCE LEHMAN

Attesting Officer    Commissioner of Patents and Trademarks